United States Patent
Gooth et al.

(10) Patent No.: US 11,143,931 B2
(45) Date of Patent: Oct. 12, 2021

(54) RECONFIGURABLE INTERFERENCE

(71) Applicant: International Business Machines Corporation, Armonk, NY (US)

(72) Inventors: Johannes Gooth, Horgen (CH); Bernd Gotsmann, Horgen (CH); Fabian Menges, Urdorf (CH)

(73) Assignee: International Business Machines Corporation, Armonk, NY (US)

( * ) Notice: Subject to any disclaimer, the term of this patent is extended or adjusted under 35 U.S.C. 154(b) by 449 days.

(21) Appl. No.: 16/251,197

(22) Filed: Jan. 18, 2019

(65) Prior Publication Data

US 2019/0171083 A1    Jun. 6, 2019

Related U.S. Application Data

(63) Continuation of application No. 15/685,064, filed on Aug. 24, 2017, now Pat. No. 10,261,384.

(51) Int. Cl.
*G02F 1/19* (2019.01)
*G02F 1/29* (2006.01)
(Continued)

(52) U.S. Cl.
CPC ........... *G02F 1/19* (2013.01); *G02B 26/0808* (2013.01); *G02F 1/292* (2013.01); *G11B 7/00* (2013.01); *H01L 41/00* (2013.01); *H01L 45/00* (2013.01); *G01J 2003/1247* (2013.01); *G02B 5/26* (2013.01); *G02B 5/3083* (2013.01);
(Continued)

(58) Field of Classification Search
CPC ........ G02F 1/19; G02F 1/292; G02F 2203/50; G02F 2203/15; G02F 2203/62; G02F 1/17; G02F 1/0147; G02F 2201/305; G02F 1/21; G02F 2202/30; G02F 2201/307; H01L 45/147; H01L 41/00; H01L 45/00; H01L 45/146; H01L 45/065; H01L 45/1286;
(Continued)

(56) References Cited

U.S. PATENT DOCUMENTS 7,113,673 B2    9/2006  Lipson et al.
8,259,381 B2    9/2012  Kaye et al.
(Continued)

OTHER PUBLICATIONS

Cui et al., "Coding metamaterials, digital metamaterials and programmable metamaterials," Light: Science & Applications, 2014, 3, e218, pp. 1-9. DOI: 10.1038/lsa.2014.99.
(Continued)

*Primary Examiner* — Jack Dinh
(74) *Attorney, Agent, or Firm* — James L. Olsen

(57) ABSTRACT

Aspects of the present disclosure are directed to a reconfigurable interference device comprising a phase change structure. The phase change structure comprises a solid-state phase change material having a first phase state and a second phase state dependent on temperature. A first energy source is configured to supply an initialization energy to initialize a plurality of domains having the first phase state and a second energy source is configured to supply an electrical current to the structure to position the plurality of domains of the first phase state within the phase change structure. A control unit is configured to control the first and the second energy source and to create a periodic interference pattern comprising a plurality of domains of the first phase state and a plurality of domains of the second phase state in an alternating pattern.

20 Claims, 7 Drawing Sheets

(51) Int. Cl.
| | |
|---|---|
| *H01L 41/00* | (2013.01) |
| *G02B 26/08* | (2006.01) |
| *G11B 7/00* | (2006.01) |
| *H01L 45/00* | (2006.01) |
| *G02F 1/01* | (2006.01) |
| *G02F 1/17* | (2019.01) |
| *G02F 1/21* | (2006.01) |
| *G02B 5/26* | (2006.01) |
| *G02B 5/30* | (2006.01) |
| *G01J 3/12* | (2006.01) |

(52) U.S. Cl.
CPC ............. *G02F 1/0147* (2013.01); *G02F 1/17* (2013.01); *G02F 1/21* (2013.01); *G02F 2201/305* (2013.01); *G02F 2201/307* (2013.01); *G02F 2202/30* (2013.01); *G02F 2203/15* (2013.01); *G02F 2203/50* (2013.01); *G02F 2203/62* (2013.01)

(58) Field of Classification Search
CPC .... G02B 26/0808; G02B 5/26; G02B 5/3083; G11B 7/00; G01J 2003/1247
See application file for complete search history.

(56) References Cited

U.S. PATENT DOCUMENTS

| | | | |
|---|---|---|---|
| 8,655,189 | B2 | 2/2014 | Almassy et al. |
| 8,797,382 | B2 | 8/2014 | Li et al. |
| 8,867,121 | B2 | 10/2014 | Lavrentovich et al. |
| 8,917,440 | B2 | 12/2014 | Kim et al. |
| 2011/0175047 | A1 | 7/2011 | Ramanathan et al. |
| 2012/0056148 | A1 | 3/2012 | Kakegawa et al. |
| 2016/0149113 | A1 | 5/2016 | Yang et al. |

OTHER PUBLICATIONS

Liu et al., "Three-dimensional photonic metamaterials at optical frequencies," Nature Materials, Jan. 2008 (published online: Dec. 2007), vol. 7, pp. 31-37.
Rensberg et al., "Active Optical Metasurfaces Based on Defect-Engineered Phase-Transition Materials," Nano Letters, 2016, vol. 16, No. 2, pp. 1050-1055 (Abstract).
Silva et al., "Performing Mathematical Operations with Metamaterials," Science, Jan. 2014, vol. 343, pp. 160-163.
Soukoulis et al., "Past achievements and future challenges in the development of three-dimensional photonic metamaterials," Nature Photonics, vol. 5, 2011, pp. 523-530. DOI: 10.1038/nphoton.2011.154.
Wang et al., "Optically Reconfigurable Photonic Devices," arXiv.org, Physics, arXiv: 1508.03818, submitted: Aug. 16, 2015, last revised Oct. 18, 2015, pp. 1-12. https://arxiv.org/ftp/arxiv/papers/1508/1508.03818.pdf.
Wang et al., "Optically reconfigurable metasurfaces and photonic devices based on phase change materials," Nature Photonics, Jan. 2016, vol. 10, pp. 60-65.
Wen et al., "Helicity multiplexed broadband metasurface holograms," Nature Communications, vol. 6, Article No. 8241, Sep. 10, 2015 (received May 13, 2015), pp. 1-7. DOI: 10.1038/ncomms9241.
Yu et al., "Flat optics with designer metasurfaces," Nature Materials, vol. 13, Feb. 2014, pp. 139-150. DOI: 10.1038/nmat3839.
Zheludev et al., "From metamaterials to metadevices," Nature Materials, Nov. 2012, vol. 11, pp. 917-924. DOI: 10.38/nmat3431.
"Distributed Bragg reflector," Wikipedia, printed: Jul. 18, 2017, pp. 1-3. https://en.wikipedia.org/wiki/Distributed_Bragg_reflector.
Fisher, B., "Metal-semiconductor domain configurations during switching of VO2 single crystals," Journal of Physics C: Solid State Physics, 1976, vol. 9, No. 7, pp. 1201-1209.
Fisher, B., "Moving boundaries and travelling domains during switching of VO2 single crystals," Journal of Physics C: Solid State Physics, 1975, vol. 8, No. 13, (Abstract). http://iopscience.iop.org/article/10.1088/0022-3719/8/13/016.
Gu et al., "Current-Driven Phase Oscillation and Domain-Wall Propagation in WxV1-xO2 Nanobeams," Nano Letters, 2007, vol. 7, No. 2, pp. 363-366.
Hendrickson et al., "Electrically actuated phase-change pixels for transmissive and reflective spatial light modulators in the near and mid infrared," Applied Optics, Dec. 20, 2015, vol. 54, Issue 36, pp. 10698-10704, OSA Publishing. https://doi.org/10.1364/AO.54.010698.
Kumar et al., "Chapter 17: Tunable Hollow Optical Waveguide and Its Applications," from "Frontiers in Guided Wave Optics and Optoelectronics," (Edited by: Bishnu Pal), Feb. 2010, pp. 343-363.
Rude et al., "Ultrafast and Broadband Tuning of Resonant Optical Nanostructures Using Phase-Change Materials," arXiv.org, Physics, arXiv:1506.03739, submitted: Jun. 11, 2015, last revised: Oct. 29. 2015, pp. 1-12. https://arxiv.org/ftp/arxiv/papers/1506/1506.03739.pdf.
Wang et al., "Tunable Bragg filters with a phase transition material defect layer," Optics Express, Sep. 5, 2016, vol. 24, No. 18, pp. 20365-20372, OSA Publishing. http://dx.doi.org/10.1364/OE.24.020365.
Gooth et al., "Programmable Metamaterial," U.S. Appl. No. 15/685,087, filed Aug. 24, 2017.
Gooth et al., "Reconfigurable Interference", U.S. Appl. No. 15/685,064, filed Aug. 24, 2017.
IBM, List of IBM Patents or Patent Applications Treated as Related, Jan. 17, 2019, 2 pages.

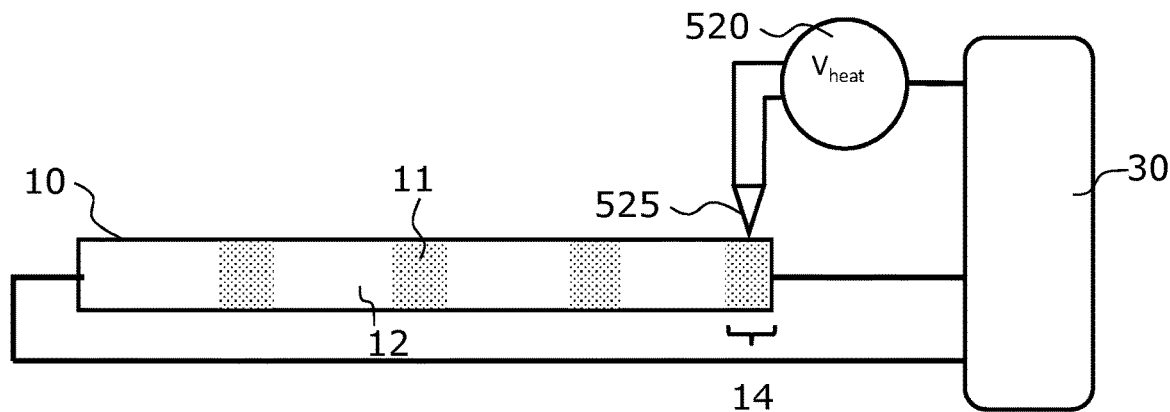
FIG. 5    500
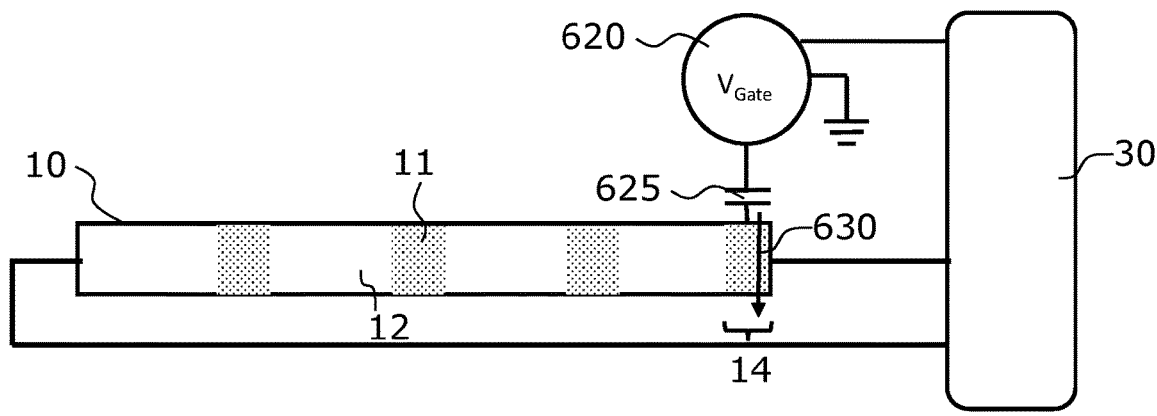
FIG. 6    600
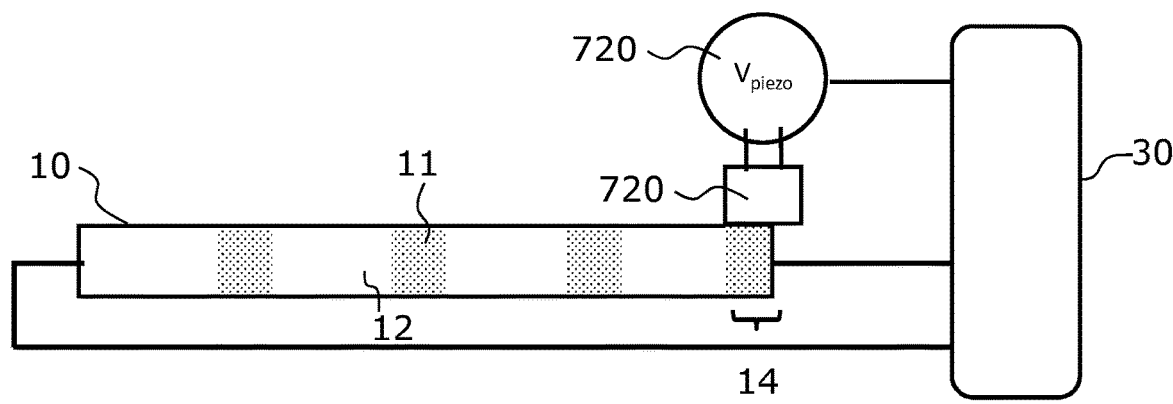
FIG. 7    700

RECONFIGURABLE INTERFERENCE

BACKGROUND

The present disclosure relates generally to interference devices, and more particularly to interference filters and interference mirrors.

Metamaterials are artificial materials which are capable of influencing the propagation of electromagnetic radiation through interacting structures which are small compared to a given design wavelength. Microscopic split-ring resonators on a planar substrate are a basic example of a two-dimensional metamaterial or metasurface which can also be extended into the third dimension by repetition. The optically accessed microscopic structures of a metamaterial can be designed in a way that the resulting material features optical properties which cannot be found in natural materials. For instance, it is possible to create metamaterials with a negative refractive index.

SUMMARY

According to a first aspect, the disclosure is embodied as a reconfigurable interference device comprising a phase change structure. The phase change structure comprises a solid-state phase change material having a first phase state and a second phase state dependent on the temperature. A first energy source is configured to supply an initialization energy to initialize a plurality of domains having the first phase state and a second energy source is configured to supply an electrical current to the structure to position the plurality of domains of the first phase state within the phase change structure. A control unit is configured to control the first and the second energy source and to create a periodic interference pattern comprising a plurality of domains of the first phase state and a plurality of domains of the second phase state in an alternating pattern. The disclosure further concerns a related method and a related computer program product.

Embodiments of the disclosure will be described in more detail below, by way of illustrative and non-limiting examples, with reference to the accompanying drawings. The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 5 shows a reconfigurable interference device comprising a heat source, in accordance with embodiments of the present disclosure.

FIG. 6 shows a reconfigurable interference device comprising an electric field source, in accordance with embodiments of the present disclosure.

FIG. 7 shows a reconfigurable interference device comprising a piezoelectric device, in accordance with embodiments of the present disclosure.

Figure 1:
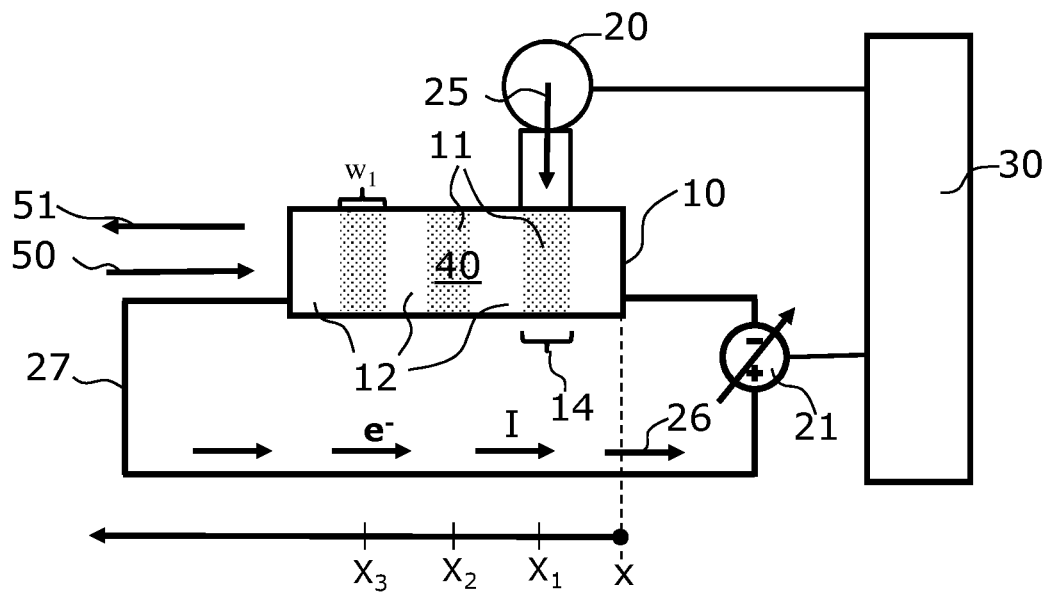
FIG. 1 shows a reconfigurable interference device configured as optical mirror in a first configuration, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relates generally to interference devices, and more particularly to interference filters and interference mirrors. While the present disclosure is not necessarily limited to such applications, various aspects of the disclosure may be appreciated through a discussion of various examples using this context.

Bragg mirrors are an example of an interference device which allow a discrimination of frequencies by using sharp, frequency dependent transmission-reflectance transitions. Bragg mirrors are also used for other applications, such as spectrometry or lasers.

Bragg mirrors, however, are either static devices or can hardly be tuned dynamically in real time. This is a limiting factor for applications and integration density.

Interference devices may be used for telecommunication and for future information processing systems. Due to size, cost per transmission channel, and limits in multiplexing of a single channel, the data rate and/or the information processing is limited as well.

Multiplexing by using various optical frequencies in the same channel may be used to increase the throughput. For this, optical components are desired that allow filtering one of the carrier frequencies out of the superposition of signals to various frequencies.

Accordingly, there is a need for advanced interference devices.

According to a first aspect, the disclosure is embodied as a reconfigurable interference device comprising a phase change structure. The phase change structure comprises a solid-state phase change material having a first phase state and a second phase state dependent on the temperature. A first energy source is configured to supply an initialization energy to initialize a plurality of domains having the first phase state and a second energy source is configured to supply an electrical current to the structure to position the plurality of domains of the first phase state within the phase change structure. A control unit is configured to control the first and the second energy source and to create a periodic interference pattern comprising a plurality of domains of the first phase state and a plurality of domains of the second phase state in an alternating pattern.

Such an embodied device may allow a flexible and efficient configuration and reconfiguration of the interference device. This allows to adapt the interference device to the needs of the respective application. The creation of a respective interference pattern is controlled by the control unit. While the first energy source is used to initialize the domains of the first phase state, the second energy source is used for the movement and the positioning of the domains of the first phase state. The first phase state and the second phase state are different phase states.

The first and the second phase state are embodied as solid phase states. The transition between the first solid phase state and the second solid phase state may be embodied as a first order phase transition. A first order phase transition may be defined as a phase transition that involves the absorption or release of latent heat.

According to an embodiment, the device is configurable to create domains of the first phase state and the second phase state of variable width and/or position.

This allows to change and to tune the characteristics of the interference device, in particular a bandwidth and/or a center frequency of the interference device. More particularly, according to embodiments, the bandwidth and the center frequency can be tuned individually. In particular, the width and/or position of the phase change regions in the interference device may be adjusted such that Bragg criteria are fulfilled for a desired frequency.

According to embodiments, the tuning or reconfiguration of the interference filter can be performed on a time scale in the MHz range.

According to an embodiment, the first phase state is a metallic state and the second phase state is an insulating state.

According to such an embodiment, local Peltier effects can be used to move and position first domains of the first phase state. More particularly, according to such an embodiment the first energy source creates a metallic domain having a metallic state. The metallic domain is separated by domain walls from insulating domains having an insulating state. The second energy source is configured to provide an electrical current to the phase change structure and thereby to move the metallic domain along the phase change structure by means of local Peltier effects at the domain walls. More particularly, according to embodiments the electrical current is used as pump current to induce Peltier heating/cooling that is large enough to succeeding the phase transition temperatures of the solid-state phase change material. By locally heating one side of the domains of the first phase state and cooling the other side, the domains of the first phase state will move along the structure as long as the temperature of the structure is in-between the transition temperature of the phase transitions (from metallic to insulating and from insulating to metallic).

According to an embodiment including a metal-insulator material, the solid state phase change material is a correlated oxide, in particular Vanadium Dioxide ($VO_2$). The transition temperature between the insulating phase state and the metallic phase state of $VO_2$ is approximately in a range between 65° C. and 75° C. At room temperature, $VO_2$ is still well below the transition temperature and hence in the insulating state. And with some heating, $VO_2$ can easily and efficiently be brought above the transition temperature, thereby transition it to the metallic state.

Other metallic materials include $V_4O_7$, $V_6O_{11}$, $V_2O_3$, $V_6O_{13}$, $V_5O_9$, $VO$, $V_8O_{15}$, $NbO_2$, $Ti_2O_3$, $LaCoO_3$, $Ti_3O_5$, $SmNiO_3$, $NdNiO_3$, $PrNiO_3$ or $Fe_3O_4$.

According to an embodiment, the device is configured to control the width of the first domains by supplying an initialization energy by the first energy source and an electrical current by the second energy source simultaneously.

According to such an embodiment the width of the first domains can be controlled electronically in an efficient and reliable way. More particularly, according to an embodiment, the device is configured to control the width by varying the time period during which the initialization energy and the electrical current are supplied concurrently and/or by varying the current strength. The longer the time period, the greater the width. Furthermore, the greater the current strength, the greater the width.

According to an embodiment, the device is configurable as interference filter, in particular as Bragg filter. Such an interference filter can be configured and reconfigured in a flexible and efficient way. In particular, according to an embodiment, the interference filter is configurable to tune the bandwidth and/or the center frequency of the interference filter.

According to an embodiment, the device is configurable as optical mirror, in particular as Bragg-mirror. Such an optical mirror can be configured and reconfigured in a flexible and efficient way. In particular, the optical mirror is configurable to tune the bandwidth and/or the center frequency of the optical mirror. This allows to operate the device as spectrometer.

According to an embodiment, the first energy source is a heat source configured to supply heat to a first area of the phase change structure. The supplied heat changes the phase state of the phase change structure and creates a domain having the first phase state.

According to an embodiment, the first energy source is a piezoelectric device configured to apply strain to a first area of the phase change structure. The applied strain changes the phase state of the phase change structure and creates a domain having the first phase state. More particularly, by applying strain, a tuning of the phase change characteristics of the phase change structure in the first area can be achieved. In particular, the transition temperatures between the first phase state and the second phase state may be tuned such that domains of the first phase state are created by the application of strain.

According to an embodiment, the first energy source is an electric field source configured to apply an electric field on a first area of the phase change structure. The applied electrical field changes the phase state of the phase change structure and creates a domain having the first phase state. More particularly, by applying an electrical field, a tuning of the phase change characteristics of the phase change structure in the first area can be achieved. In particular, the transition temperatures between the first phase state and the second phase state may be tuned such that domains of the first phase state are created by the application of an electric field.

According to a further embodiment, the device comprises temperature control means configured to keep the temperature of the first domains between a first transition temperature and a second transition temperature.

The transition behavior of the solid-state phase change material exhibits according to embodiments a hysteresis-behavior having a first and a second transition temperature between the first and the second phase state. The first transition temperature is the transition temperature from the second phase state to the first phase state and the second transition temperature is the transition temperature from the second phase state to the first phase state. By keeping the temperature of the first domain between the first transition temperature and the second transition temperature, the movement of the first domain is facilitated and it can be ensured that the first domain maintains the first phase state.

The temperature control means may be embodied by passive components such as suitable isolation measures of the phase change structure and/or by active components such as an active temperature controller.

According to a further embodiment, the heat source is an unsteady heat source operable to supply heat pulses to the first area.

If the unsteady heat source supplies a heat pulse, the heat is absorbed by the phase change structure and a first domain (e.g., a metallic domain) can be created. After the heat pulse, the temperature in the first area drops below the transition temperature from the second phase state (e.g., the insulating phase state) to the first phase state (e.g., the metallic phase state). This enables a depinning of the first domain, and movement of the first domain along the structure.

According to a further embodiment, the heat source is a steady heat source operable to supply steadily heat, wherein the interference device further comprises a thermal switch arranged between the steady heat source and the first area, the thermal switch being configured to control the heat transferred from the steady heat source to the first area.

According to a further embodiment, the thermal switch is a device to switch between at least two thermal conductance states in response to a mechanical stimulus or an electrical stimulus.

According to such an embodiment, the depinning of the first domain and the subsequent movement of the first domain along the structure can be initiated and controlled by the thermal switch. More particularly, when the thermal switch is closed, heat is supplied to the first area of the phase change structure and a first domain is created. Then the thermal switch can be turned off (e.g., opened) so that no further heat is supplied to the first area or the heat supplied to the first area is at least reduced. As a result, the temperature in the first area drops below the transition temperature from the second phase state to the first phase state and accordingly the first domain can be depinned and movement of the first domain can be initiated.

According to a further embodiment, the control unit is configured to control the amplitude and/or the frequency of the electrical current supplied by the second energy source.

This allows controlling the movement of the first domain during its motion along the structure. As an example, the amplitude of the electrical current will control the velocity of the first domain.

Generally, the geometrical shape of the phase change structure may have any desired form and any desired dimension. As the structure always has a solid state, it can be flexibly adapted to the needs of the respective application. According to embodiments, the structure may be rod shaped. The rod may have dimensions in the nanoscale or microscale. According to an embodiment, the phase change structure may be a nanowire.

According to another embodiment, the first area of the solid-state phase change material may be doped to tune the phase change characteristics of the phase change structure in the first area.

This may be used to tune the phase change characteristics according to the needs of the respective application.

According to another aspect, a method for configuring an interference device according to the first aspect is provided. The method comprises steps of supplying, by the first energy source, an initialization energy to initialize a plurality of domains having the first phase state and supplying, by the second energy source, an electrical current to the structure to position domains of the first phase state within the phase change structure. The method comprises further steps of controlling, by the control unit, the first and the second energy source and creating, by the control unit, a first periodic interference pattern comprising in an alternating way a plurality of domains of the first phase state and a plurality of domains of the second phase state. In this respect, it should be noted that one or more of the steps may be performed concurrently.

The method may comprise a further step of reconfiguring the interference device by creating a second periodic interference pattern comprising in an alternating way a plurality of domains of the first phase state and a plurality of domains of the second phase state, wherein the domains of the second periodic interference pattern have a different width and/or position than the domains of the first interference pattern.

According to another aspect, a computer program product for operating an interference device according to the first aspect is provided. The computer program product comprises a computer readable storage medium having program instructions embodied therewith, the program instructions executable by the interference device to perform a method comprising supplying, by the first energy source, an initialization energy to initialize a plurality of domains having the first phase state and supplying, by the second energy source, an electrical current to the structure to position domains of the first phase state within the phase change structure. The method comprises further steps of controlling, by the control unit, the first and the second energy source and creating, by the control unit, a first periodic interference pattern comprising in an alternating way a plurality of domains of the first phase state and a plurality of domains of the second phase state.

Embodiments of the invention will be described in more detail below, by way of illustrative and non-limiting examples, with reference to the accompanying drawings FIG. 1 shows a reconfigurable interference device 100 according to an embodiment of the disclosure. The interference device 100 is configured in a first configuration. The interference device 100 comprises a phase change structure 10. The phase change structure 10 comprises or consists of a solid-state phase change material that may be in two different phase states, namely a first phase state and a second phase state. More particularly, it depends on the temperature of the phase change structure 10 in which phase state the phase change structure 10 is. Accordingly, the respective phase state of the phase change material can be changed by heating or cooling the solid state phase change material. In both the first and the second phase state, the solid state phase change material has a solid state.

The interference device 100 comprises a first energy source 20, which is configured to supply an initialization energy 25 to initialize or in other words create a plurality of first domains 11 having the first phase state. More particularly, the first energy source 20 supplies the initialization energy 25 to a first area 14 of the phase change structure 10. It is assumed that without receiving the initialization energy from the first energy source 20, the solid state phase change material is in the second state. But if the first energy source 20 supplies sufficient initialization energy to the first area 14 of the phase change structure 10, the phase state of the solid state phase change material in the first area 14 switches from the second phase state to the first phase state.

Furthermore, the interference device 100 comprises a second energy source 21, which is configured to supply an electrical current 26 to the phase change structure 10 to position the first domains 11 of the first phase state within the phase change structure 10. The second energy source 21 is embodied as electrical energy source and may be, for example, implemented as a current source or voltage source. More particularly, the second energy source 21 may be arranged in an electrical supply circuit 27 that provides a flow of the electrical current 26 through the phase change structure 10. By the electrical current 26, the first domains 11 can be moved and positioned along the phase change structure 10.

In addition, a control unit 30 is configured to control the first energy source 20 and the second energy source 21 and to create a periodic interference pattern 40 comprising in an alternating way a plurality of first domains 11 of the first phase state and a plurality of second domains 12 of the second phase state.

The reconfigurable interference device 100 is configured as an optical mirror and more particularly as a Bragg mirror. Such a Bragg mirror may also be denoted as Bragg reflector. In this respect, the phase change structure 10 forms in an alternating way layers of the first domains 11 having the first phase state and layers of the second domains 12 having the second phase state. In some embodiments, the first domains 11 can have a different refractive index than the second domains 12.

The first phase state of the first domains 11 may be in a metallic state and the second phase state of the second domains 12 may be in an insulating state.

According to such an embodiment, local Peltier effects can be used to move the first domains 11 from the first area 14 along the x-direction to positions $x_i$ (e.g., positions $x_1$, $x_2$ and $x_3$) within the phase change structure 10. More particularly, according to such an embodiment the first energy source 20 initializes or in other words creates a metallic domain having a metallic state. The metallic domain is separated by domain walls from insulating domains having an insulating state. The second energy source 21 is configured to provide an electrical current 26 to the phase change structure 10. As a result, the metallic domain is moved along the phase change structure 10 by means of local Peltier effects at the domain walls. More particularly, according to embodiments, the electrical current 26 is used as pump current to induce Peltier heating/cooling that is large enough to exceed the phase transition temperatures of the solid-state phase change material. By locally heating one side of the first domains 11 and cooling the other side, the first domains 11 will start to move along the phase change structure 10 as long as the temperature of the phase change structure 10 is in-between the transition temperature of the phase transitions (from metallic to insulating and from insulating to metallic).

In some embodiments, the phase change material is vanadium dioxide ($VO_2$). $VO_2$ has at room temperature an insulating phase state and transitions to a metallic state at a first transition temperature of approximately 65° C. to 75° C.

$VO_2$ has a refractive index contrast around 1 in a telecommunication window between 1330 and 1550. More particularly, the metallic state of $VO_2$ has a refractive index of 2 and the insulating state of $VO_2$ has a refractive index of 2.8

Accordingly, each boundary between the first domains 11 and the second domains 12 causes a partial reflection of incident optical waves 50. For incident optical waves 50 whose vacuum wavelength is close to four times of the optical thickness of the first domains 11 and the second domains 12, a constructive interference of the partially reflected optical waves occurs. Accordingly, the interference device 100 operates at such a wavelength as a high-quality mirror/high-quality Bragg reflector.

The interference device 100 is reconfigurable. More particularly, the interference device 100 can create first domains 11 of the first phase state and second domains 12 of the second phase state of variable width $w_i$ and position $x_i$. The positions $x_i$ denote the position of the respective first domain 11 in an x-direction. The x-direction extends in parallel to the phase change structure. More particularly, in the first configuration of the phase change structure 10 as illustrated in FIG. 1, the phase change structure 10 comprises three first domains 11 at positions $x_1$, $x_2$ and $x_3$, each having a width $w_1$.

By varying the width and position of the domains 11, 12, the interference device 100 can tune the bandwidth and the center frequency of the optical mirror. Accordingly, it may operate as spectrometer.

Figure 2:
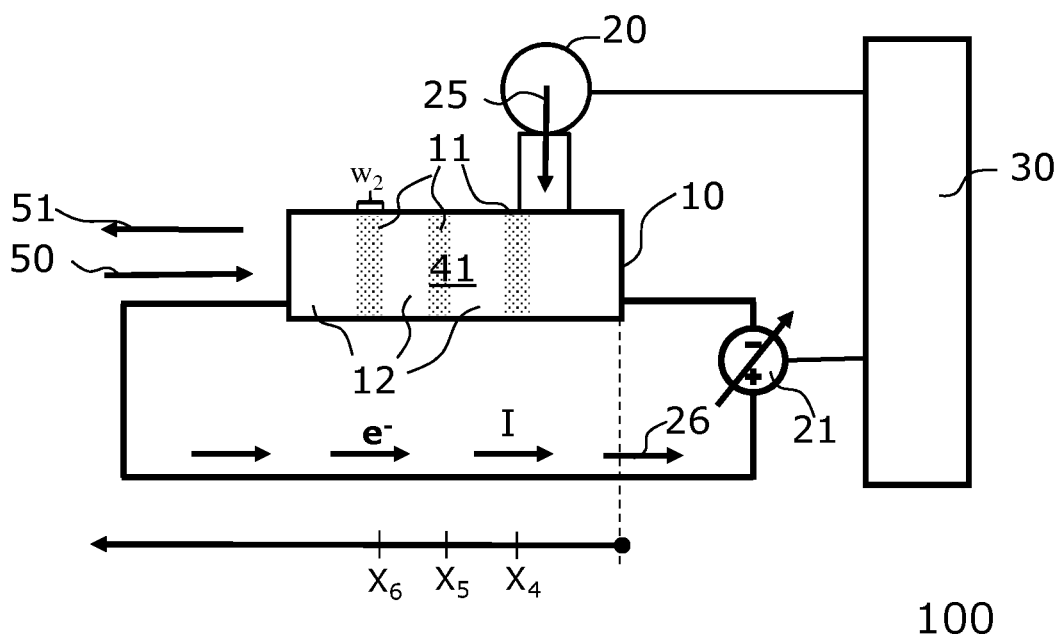
FIG. 2 shows the reconfigurable interference device of FIG. 1 configured in a second configuration, in accordance with embodiments of the present disclosure.

FIG. 2 shows the reconfigurable interference device 100 of FIG. 2 being configured in a second configuration. In the second configuration, the first domains 11 and the second domains 12 have a different width $w_i$ (e.g., $w_2$) and a different position $x_i$ (e.g., $x_4$, $x_5$ and $x_6$) than the first domains 11 and the second domains 12 illustrated in the first configuration of FIG. 1. This results in a different center frequency and a different bandwidth than in the first configuration. More particularly, in the second configuration of the phase change structure 10 as illustrated in FIG. 2, the phase change structure 10 comprises three first domains 11 at positions $x_4$, $x_5$ and $x_6$, each having a width $w_2$.

In a similar way, a plurality of desired configurations can be programmed by the control unit 30. Accordingly, the interference device 100 can be flexibly adapted and tuned to the needs of the respective application.

Figure 3:
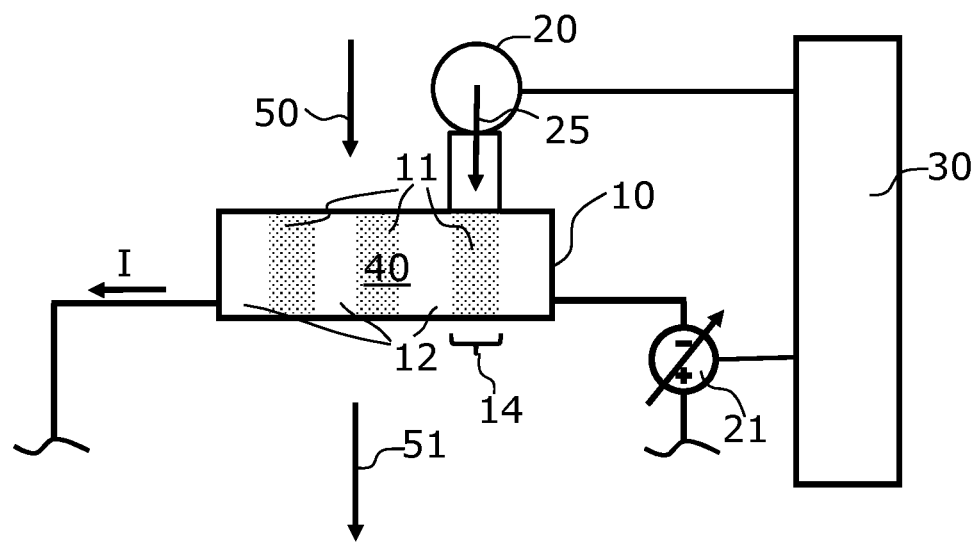
FIG. 3 shows a reconfigurable interference device configured as optical interference filter in a first configuration, in accordance with embodiments of the present disclosure.

FIG. 3 shows a reconfigurable interference device 300, according to an embodiment of the present disclosure. The interference device 300 is configured in a first configuration corresponding to the interference device 100 of FIG. 1. Accordingly, it comprises the interference pattern 40 with the first domains 11 at the positions $x_1$, $x_2$ and $x_3$. However, in contrast to the embodiments as illustrated with reference to FIGS. 1 and 2, the interference device 300 is configured to operate as interference filter.

More particularly, the phase change structure 10 of FIG. 3 is adapted to receive incident optical waves 50 from the top rather than from the side. Accordingly, the optical interference pattern 40 operates as optical grid. As a result, the incident waves 50 are diffracted by the optical grid and the transmitted optical waves 51 (e.g., the transmitted parts of the incident optical waves 50) are further processed by the interference device 300.

In other words, the interference device 300 operates as diffraction grating device, which splits and diffracts the incident optical signals 50 into several optical waves/parts traveling in different directions. The directions of these diffracted optical waves depend on the wavelength/frequency of the incoming optical signals 50, as well as the width and the position of the first domains 11 and the second domains 12. Specifically, the properties of the transmitted optical waves 51 depend on the interference pattern 40 of the interference device 300, in addition to the properties of the incident optical signals 50. Accordingly, the interference device 300 can be adapted such that for some wavelength/frequencies a constructive interference occurs, while for others a deconstructive interference occurs (e.g., or any other suitable interference pattern).

Figure 4:
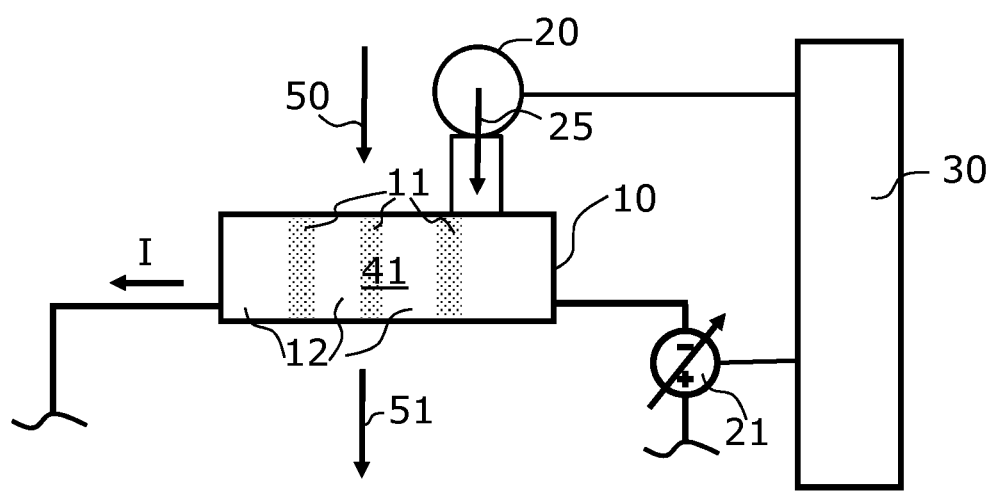
FIG. 4 shows the reconfigurable interference device of FIG. 3 configured in a second configuration, in accordance with embodiments of the present disclosure.

FIG. 4 shows the reconfigurable interference device 300 of FIG. 3 being configured in the second configuration 41 corresponding to the configuration of FIG. 2. Accordingly, it comprises the interference pattern 41 with the first domains 11 having a width $w_2$ and being arranged at the positions $x_4$, $x_5$ and $x_6$.

The different width $w_2$ and the different positions result in a different center frequency and a different bandwidth of the interference filter 300 than in the first configuration.

Accordingly, by changing the width and/or the positions of the first domains 11, the interference filter 300 can be flexibly adapted and tuned to the needs of the respective application. Specifically, embodiments of the present disclosure can be fine-tuned to alter the properties of the transmitted optical waves 51 as desired.

FIG. 5 shows a reconfigurable interference device 500 including a heat source 520, according to an embodiment of the present disclosure. The interference device 500 comprises a heat source 520 as a domain inducing component. The heat source 520 is configured to supply thermal heat via a hot tip 525 to the first area 14 of the structure 10. It is assumed that without receiving heat from the heat source 520, the solid state phase change material is in the second state. But if the heat source 520 supplies sufficient thermal heat to the first area 14 of the structure 10, the phase state of the solid state phase change material in the first area 14 switches from the second phase state to the first phase state. As a result, the first domains 11 can be created in the first area 14. The first domains 11 store latent heat and are separated by domain walls from the solid state phase change material of the second phase state. The solid state phase change material of the second phase state forms second domains 12 that surround the first domains 11.

FIG. 6 shows a reconfigurable interference device 600 including an electric field source 620, according to an embodiment of the disclosure present. The interference device 600 comprises an electric field source 620 as a domain inducing component. The electric field source 620 is configured to apply an electric field 630 on the first area 14 of the phase change structure 10. More particularly, the electric field source 620 supplies a voltage $V_{Gate}$ to a capacitor 625 and thereby the electric field 630 to the first area 14. The electric field 630 influences the transition temperatures and switching points between the first phase state and the second phase state. This can be used to switch the phase state of the phase change structure 10 in the first area 14.

More particularly, it is assumed that without the application of the electric field 630, the solid state phase change material is in the second state. But if the electric field source 620 applies an electric field 630 of sufficient strength, the phase state of the solid state phase change material in the first area 14 switches from the second phase state to the first phase state. As a result, the first domains 11 can be created in the first area 14.

FIG. 7 shows a reconfigurable interference device 700 including a piezoelectric device 720, according to an embodiment of the present disclosure. The interference device 700 comprises a piezoelectric device 720 as a domain inducing component. The piezoelectric device 720 is configured to apply strain to the first area 14 of the phase change structure 10. The applied strain influences the transition temperatures and switching points between the first phase state and the second phase state. This can be used to switch the phase state of the phase change structure 10 in the first area 14. More particularly, it is assumed that without the application of the strain, the solid state phase change material is in the second state. But if the piezoelectric device 720 applies strain of sufficient strength, the phase state of the solid state phase change material in the first area 14 switches from the second phase state to the first phase state. As a result, the first domains 11 can be created in the first area 14.

Figure 8:
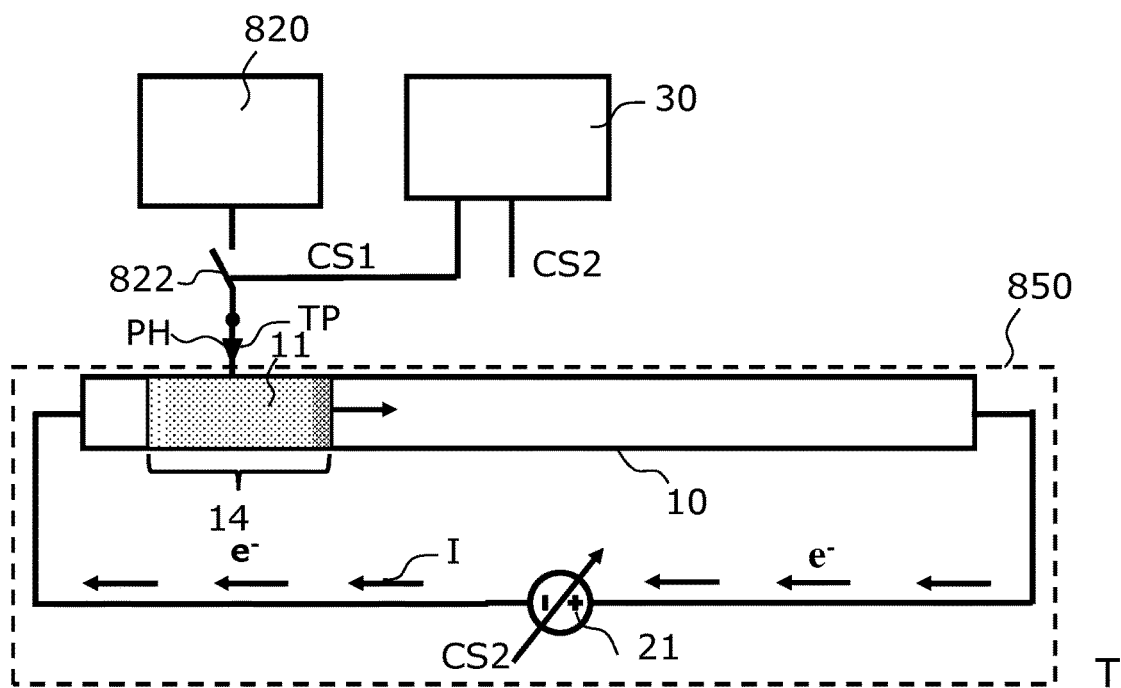
FIG. 8 shows an interference device comprising a steady heat source and a thermal switch, in accordance with embodiments of the present disclosure.

FIG. 8 shows an interference device 800 which includes a steady heat source 820, according to an embodiment of the disclosure. The steady heat source 820 is operable to supply steadily heat to the first area 14. In addition, the device 800 comprises a thermal switch 822 which is arranged between the steady heat source 820 and the first area 14 of the structure 10. The thermal switch 822 is configured to control the heat transferred from the steady heat source 820 to the first area 14. The thermal switch 822 may be a device to switch between at least two thermal conductance states in response to a mechanical stimulus or an electrical stimulus. The thermal switch may be controlled by the control unit 30. The control unit 30 is configured to provide a control signal, CS1, to the thermal switch 822 and to control the thermal switch 822 in such a way that thermal pulses, TP, are applied to the first area 14.

According to such an embodiment, the control unit 30 can control the heat supplied to the first area 14 and also the timing of the depinning of the first domains 11. When the thermal switch 822 is closed, the steady heat source 820 heats the first area 14 of the structure 10 and creates thereby a first domain 11. By opening the thermal switch 822, the heat supply to the structure 10 is interrupted. Accordingly, the temperature in the first area 14 decreases and eventually drops below the first transition temperature. As a result, first domains 11 can be depinned from the first area 14 and can move along the structure 10. Hence, by controlling the thermal switch 822, the control unit 30 can control the timing of the movement.

The control unit 30 is also adapted to control the second energy source/current source 21 by a control signal, CS2. As mentioned, in some embodiments, the electrical current I may be switched off if no transport of first domains 11 is needed. Furthermore, the amplitude can be used to control the speed of the movement of the first domains 11. In addition, the current I provides a Joule-heating of the structure 10, in addition to the Peltier heating/cooling localized at the domain walls. This Joule-heating can also be influenced and controlled by the amplitude of the current I and can be used to stabilize the temperature of the structure 10 to be in between the phase transition hysteresis.

The interference device 800 comprises a thermal isolation 850 configured to keep the temperature of the first domains 11 between the first transition temperature and the second transition temperature during movement of the domains.

Figure 9:
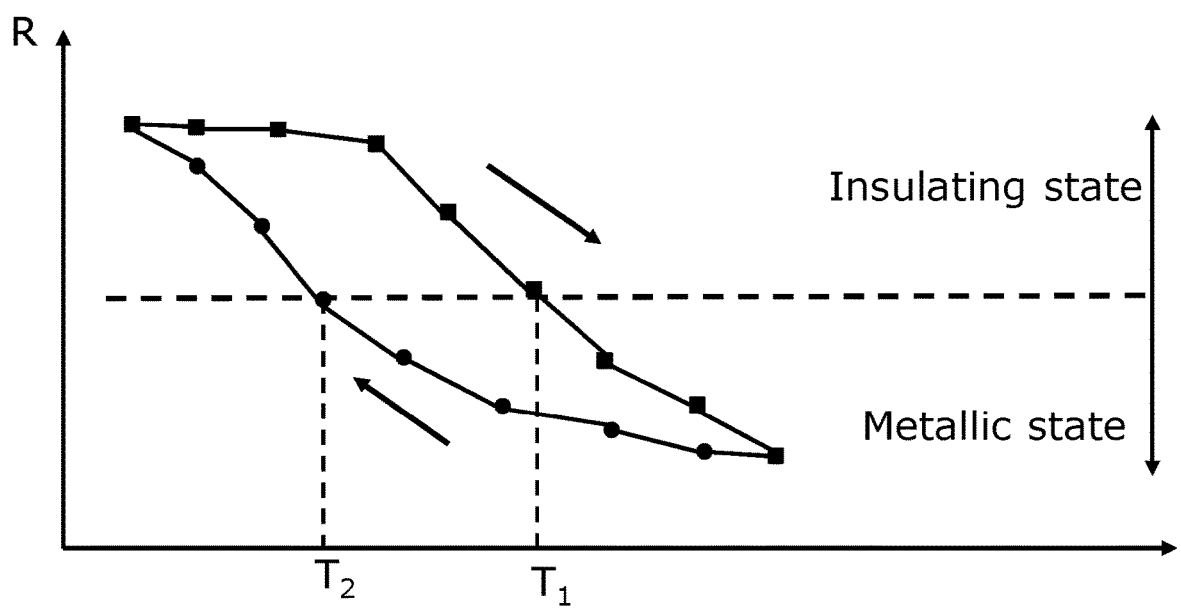
FIG. 9 illustrates a graph of an exemplary hysteresis-curve of a solid state phase change material exhibiting a metallic-insulator phase transition, in accordance with embodiments of the present disclosure.

FIG. 9 illustrates a graph of an exemplary hysteresis-curve of a solid state phase change material exhibiting a metallic-insulator phase transition.

The horizontal axis represents the material temperature, T, of the solid state phase change material and the vertical axis the resistance, R, of the phase change material.

Starting from the insulating state, the phase change material transitions from the insulating state to the metallic state at a first transition temperature, T1. In the other direction, the phase change material transitions from the metallic state to the insulating state at a second transition temperature, T2. The second transition temperature T2 is lower than the first transition temperature T1.

Figure 10A:
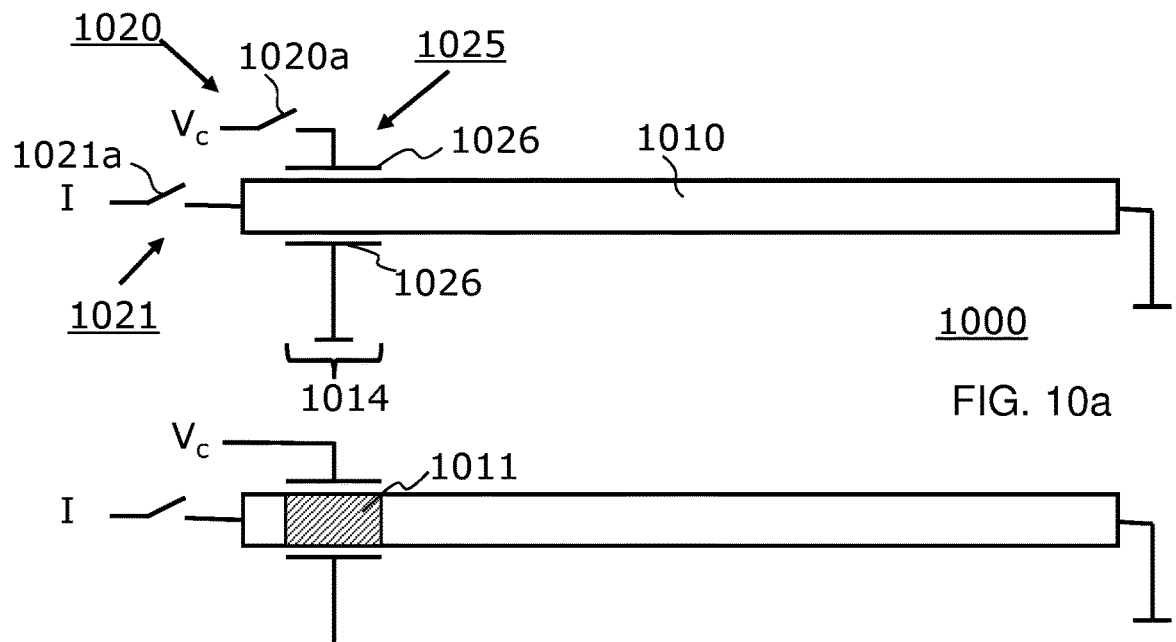
FIGS. 10a through 10e illustrate the creation of a periodic interference pattern in an interference device, in accordance with embodiments of the present disclosure.

FIGS. 10a through 10e illustrate the creation of a periodic interference pattern in an interference device 1000, according to an embodiment of the disclosure. With reference to FIGS. 10a through 10e, the reference labels shown and described in FIG. 10a can be mapped to corresponding elements shown and described in FIG. 10b through 10e. That is, the interface device 1000, electric field source 1020, switch 1020a, current source 1021, switch 1021a, phase change structure 1010, capacitor 1025, and terminals 1026 shown and described in FIG. 10a are described with reference to FIGS. 10b to 10e. Further, though the elements shown and described in FIG. 10a are the same as the elements shown and described in FIGS. 10b through 10e, one or more elements may be in a different configuration or state (e.g., switches 1020a and 1021a).

The interference device 1000 comprises a phase change structure 1010 comprising a solid-state phase change material. The interference device 1000 further comprises as first energy source an electric field source 1020 configured to supply an electric field on a first area 1014 of the phase change structure 1010. The interference device 1000 further comprises as second energy source a current source 1021 configured to supply an electrical current to the phase change structure 1010. The electric field source 1020 comprises a switch 1020a and the current source 1021. By activating the switch 1020a, a voltage $V_c$ can be applied to terminals 1026 of a capacitor 1025, thereby applying an electric field on the first area 1014 of the phase change structure 1010. By activating the switch 1021a, a driving current $I_D$ can be applied to the phase change structure 1010. With reference to the state of each switch 1020a and 1021a, an open state refers to the switches 1020a and 1021a being disconnected, such that current is not provided. A closed state refers to the switches 1020a and 1021a completing the circuit, allowing current to flow.

In FIG. 10a, both switches 1020a and 1021a are in the open state and accordingly the phase change material of the phase change structure 1010 in the second phase state. In the following, it is assumed that the structure 10 comprises a material with a metal-insulator phase transition such as $VO_2$. Accordingly, the phase change structure 1010 may be in the insulating state.

Figure 10B:
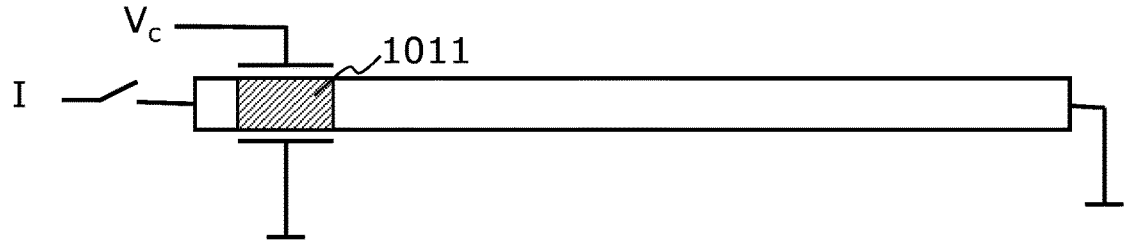

In FIG. 10b, switch 1020a is in the closed state, while the switch 1021a is still in the open state. Accordingly, the electric field source 1020 applies an electric field on the first area 1014 of the phase change structure 1010. The electric field initializes a domain 1011 of the metallic state.

Figure 10C:
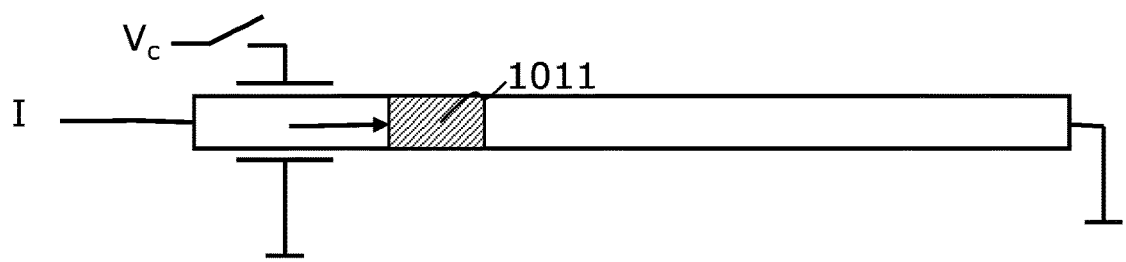

In FIG. 10c, switch 1020a is in the open state, while the switch 1021a is in the closed state. Accordingly, the current source 1021 applies the driving current $I_D$ and thereby moves the domain 1011 along the phase change structure 1010.

Figure 10D:
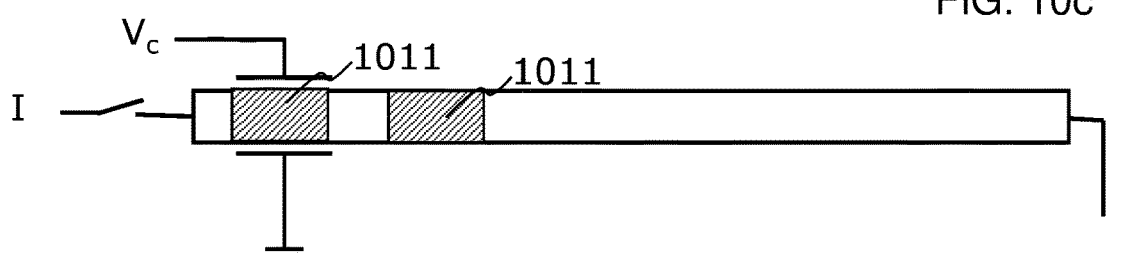

In FIG. 10d, switch 1021a is in the open state, while switch 1020a is in the closed state. Accordingly, the electric field source 1020 applies an electric field on the first area 1014 of the phase change structure 1010 and initializes another domain 1011 of the metallic state.

Figure 10E:
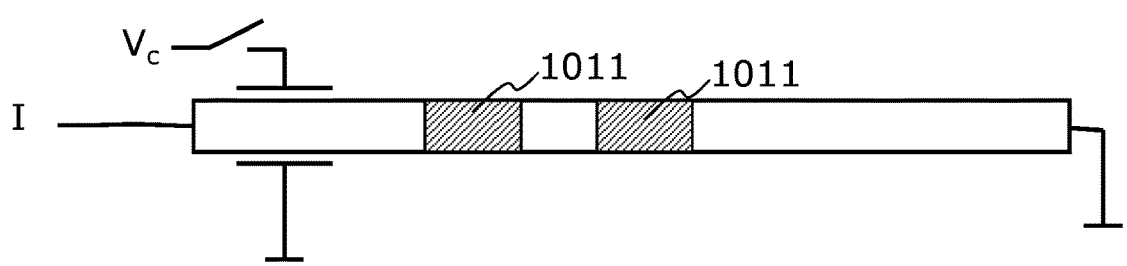

In FIG. 10e, switch 1020a is in the open state, while switch 1021a is in the closed state. Accordingly, the current source 1021 applies the driving current $I_D$ and thereby moves both first domain 1011 along the phase change structure 1020.

This sequence may be repeated until a desired interference pattern has been created, including destructive and constructive interference patterns.

According to the embodiments as illustrated with reference to FIGS. 10a to 10e, the width of the domains 1011 is mainly determined by the width of the terminals 1026 of the capacitor 1025 of the electric field source 1020. Hence according to embodiments the width of the domains 1011 may be controlled by providing terminals of different width.

Figure 11A:
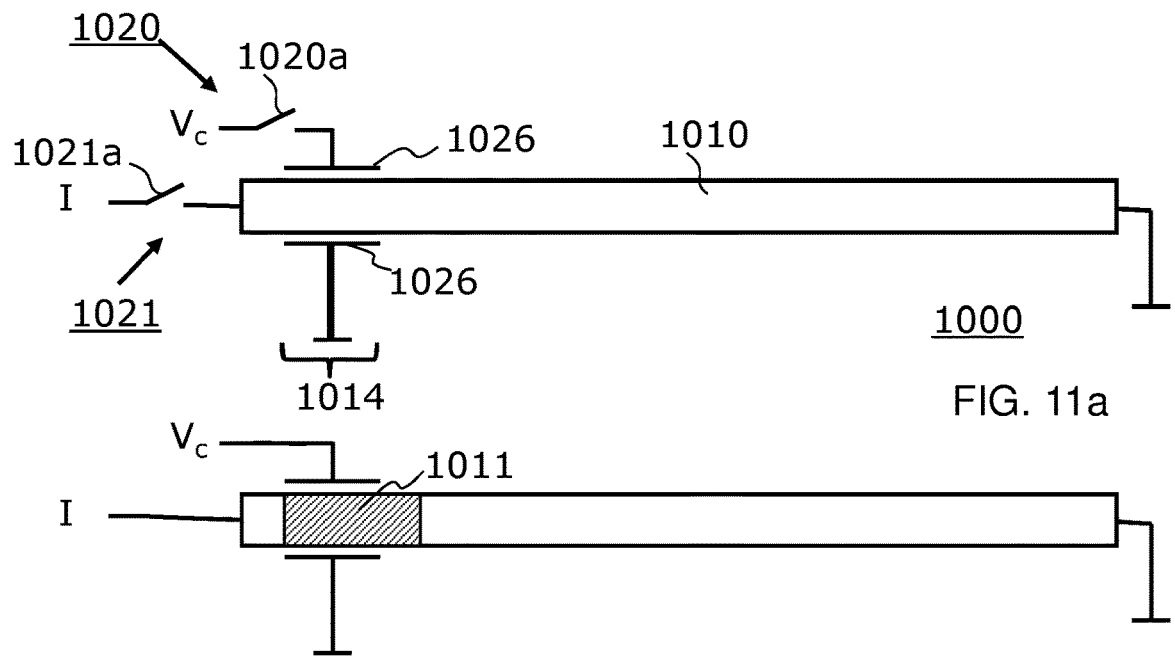
FIGS. 11a through 11e illustrate the creation of a periodic interference pattern in the interference device, in accordance with embodiments of the present disclosure.

FIGS. 11a through 11e illustrate the creation of a periodic interference pattern in the interference device 1000 of FIG. 10, according to an embodiment of the present disclosure. With reference to FIGS. 11a through 11e, the reference labels shown and described in FIG. 11a can be mapped to corresponding elements shown and described in FIGS. 11b through 11e. That is, the interface device 1000, electric field source 1020, switch 1020a, current source 1021, switch 1021a, phase change structure 1010, and terminals 1026 shown and described in FIG. 11a are described with reference to FIGS. 11b to 11e. Further, though the elements shown and described in FIG. 11a are the same as the elements shown and described in FIGS. 11b through 11e, one or more elements may be in a different configuration or state (e.g., switches 1020a and 1021a).

More particularly, according to the embodiment illustrated in FIGS. 11a to 11e, the interference device 1000 controls the width of the first domains 1011 by simultaneously supplying an initialization energy by the electric field source 1020 and an electrical current by the current source 1021.

In FIG. 11a, both switches 1020a and 1021a are in the open state and accordingly the phase change material of the phase change structure 1010 is in the second phase state (e.g., the insulating state).

Figure 11B:
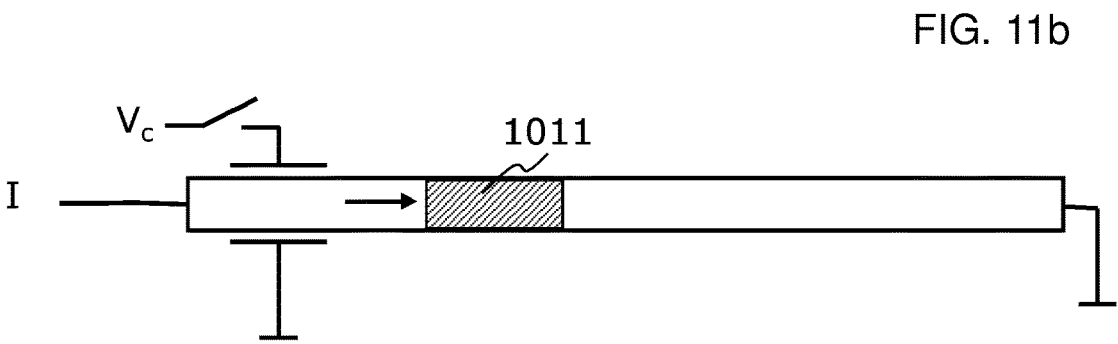

In FIG. 11b, the switches 1020a and 1021a are concurrently switched on. Accordingly, the electric field source 1020 applies an electric field on the first area 1014 of the phase change structure 1010 and the current source 1021 applies the driving current $I_D$ to the phase change structure 1010. The electric field initializes a domain 1011 of the metallic state and the driving current $I_D$ enlarges the domain 1011. The domain 1011 is enlarged until either switch 1020a or 1021a are opened.

Figure 11C:
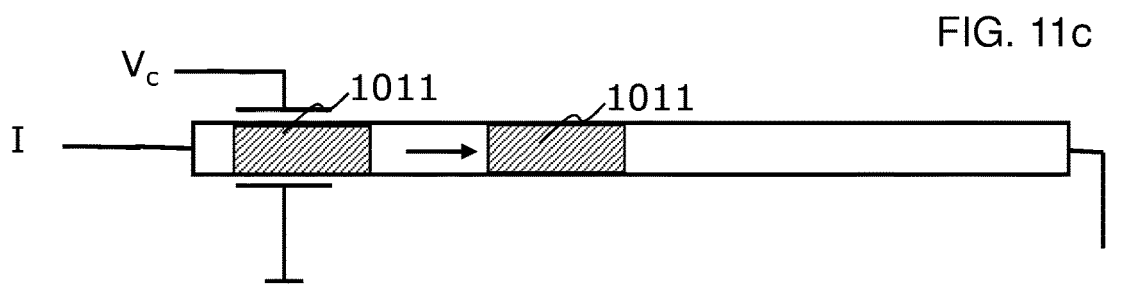
Figure 11D:
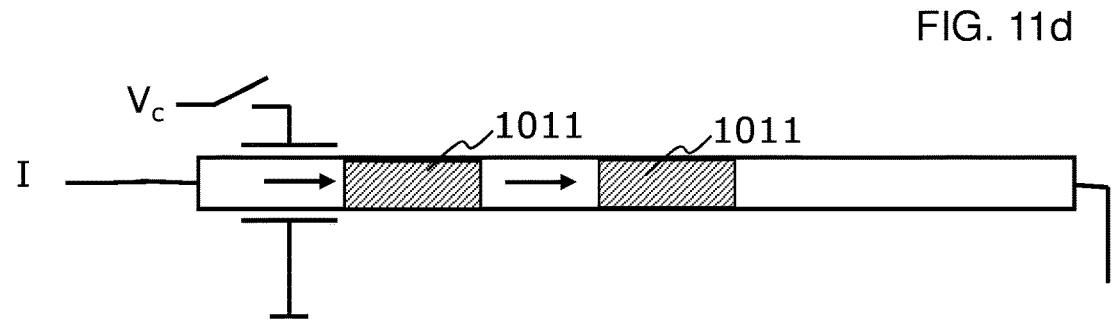

In FIG. 11c, switch 1020a is opened, while switch 1021a remains closed. Accordingly, the current source 1021 applies the driving current $I_D$ and thereby moves the domain 1011 along the phase change structure 1010.

In FIG. 11d, again both switches 1020a and 1021a are concurrently closed. Accordingly, the electric field source 1020 applies an electric field on the first area 1014 of the phase change structure 1010 and initializes another domain 1011 of the metallic state. The driving current $I_D$ enlarges the domain 1011, as the domain 1011 is shifted through phase change structure 1010 while simultaneously induced by the electric field source 1020.

Figure 11E:

In FIG. 11e, switch 1020a is opened, while the switch 1021a remains closed. Accordingly, the current source 1021 applies the driving current $I_D$ and thereby moves both domains 1011 along the phase change structure 1010.

This sequence may be repeated until a desired interference pattern has been created.

According to embodiments, the width of the domains 1011 may be controlled by the time period during which the initialization energy and the electrical current is supplied concurrently (e.g., the time period during which both switches 1020a and 1021a are simultaneously closed). The longer this time period, the wider the width of the corresponding domains 1011. In addition, the width may be controlled by the strength of the driving current $I_D$. The larger the driving current, the faster the corresponding domains 1011 are enlarged.

Figure 12:
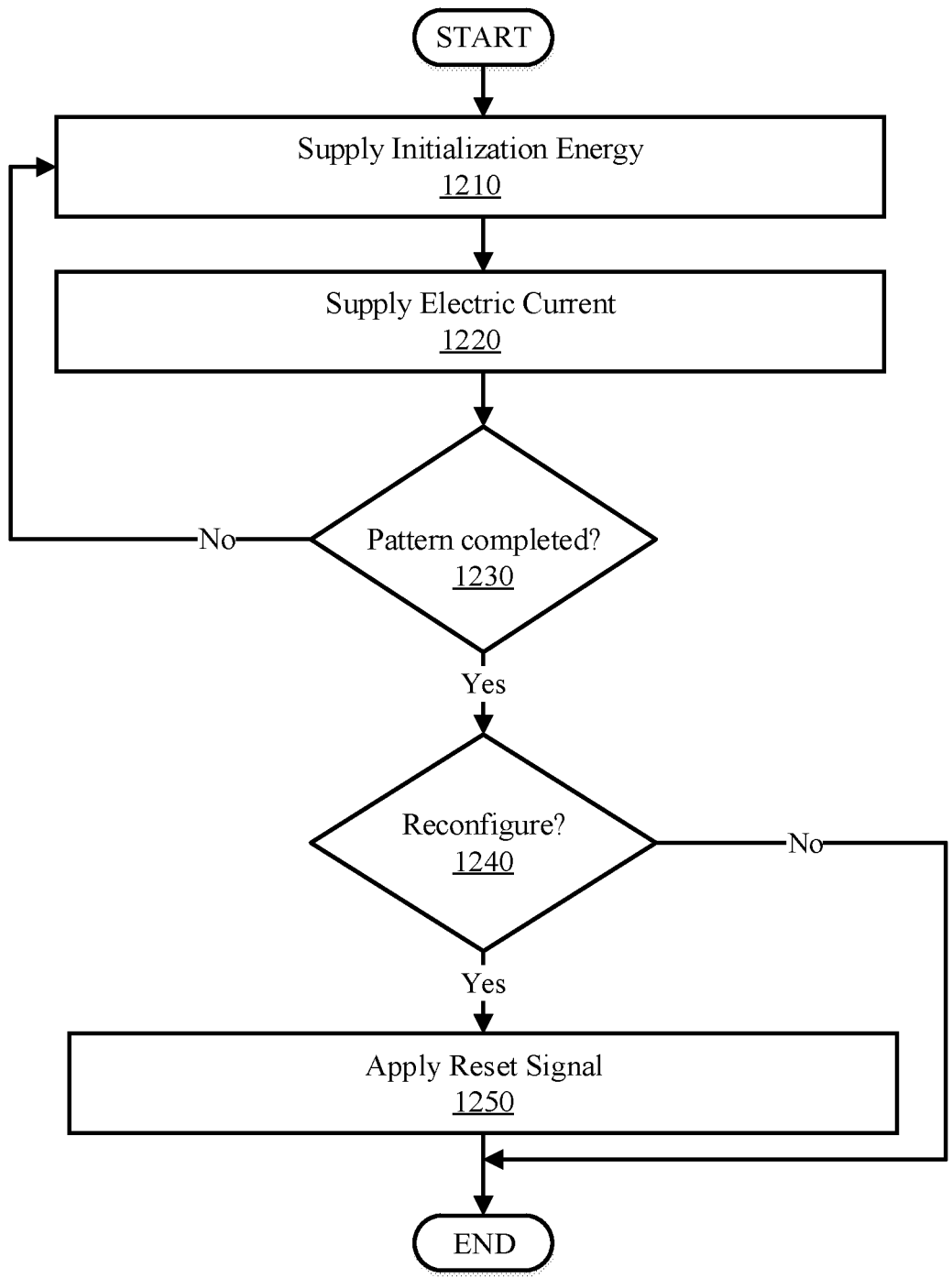
FIG. 12 shows a flow chart of an example method for creating an interference pattern, in accordance with embodiments of the present disclosure.

FIG. 12 illustrates method steps of a method for configuring an interference device, (e.g., the interference device 100 of FIGS. 1 and 2), according to an embodiment of the present disclosure.

The method may start at operation 1210 where a supply initialization energy may be provided. For example, in the embodiment illustrated in FIG. 1, the first energy source 20 supplies an initialization energy to initialize a first domain 11 having the first phase state.

After a supply initialization energy is provided, at operation 1220, an electric current may be provided (e.g., electric current 26 of FIG. 1). For example, in the embodiment illustrated in FIG. 1, the second energy source 21 supplies an electrical current 26 to the structure 10 to position the first domain 11 of the first phase state within the phase change structure 10. In some embodiments, operations 1220 and 1230 are controlled by a processor (e.g., control unit 30 of FIG. 1).

At operation 1230, a determination may be made whether the interference pattern is complete. For example, in the embodiment illustrated in FIG. 1, the control unit 30 decides/evaluates whether another first domain 11 needs to be created and positioned or whether the desired interference pattern has already been completed.

If the desired interference pattern has not been completed, one or more additional loops comprising the steps 1210, 1220 and 1230 may be performed until the desired interference pattern has been reached.

If the pattern is completed, then the method may proceed to operation 1240, where a determination may be made to reconfigure the interference pattern. If a determination is made to not reconfigure the interference pattern, then the method may end.

However, if a determination is made to reconfigure the interference pattern, then the method may proceed to operation 1250, where a reset signal may be issued. For example, in the embodiment illustrated in FIG. 1, the control unit 30 evaluates/decides if a reconfiguration of the interference pattern shall be performed. If this is the case, the control unit 30 initiates a reset of the interference pattern by applying a Reset-signal at operation 1250. In other words, the control unit 30 initiates a deletion/modification of the interference pattern 40. The Reset-signal may be a driving current that moves the first domains 11 towards the end of the phase-change structure 10. This may eliminate the first domains 11. According to another embodiment, the phase change structure 10 may be heated (e.g., by heat source 520) with a reset heat pulse such that the phase change structure 10 is reset to its initial state. In some embodiments, the control unit 30 reconfigures the interference device by creating a second periodic interference pattern (e.g., interference pattern 41 as illustrated in FIG. 2.)

The present disclosure may be a system, a method, and/or a computer program product. The computer program product may include a computer readable storage medium (or media) having computer readable program instructions thereon for causing a processor to carry out aspects of the present disclosure.

The disclosure may be embodied as a computer program product for operating a control unit of an interference device (e.g., control unit 30 as described above).

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A reconfigurable interference device, comprising
a phase change structure comprising a solid-state phase change material, the solid-state phase change material having a first phase state and a second phase state;
a first energy source configured to supply an initialization energy to initialize a plurality of domains into the first phase state;
a second energy source configured to supply an electrical current to the phase change structure to position the plurality of domains in the first phase state within the phase change structure; and
a control unit configured to control the first and second energy sources to create a periodic interference pattern.

2. The interference device according to claim 1, wherein the device is configured to create domains of the first phase state and the second phase state of variable width and/or position.

3. The interference device according to claim 1, wherein the first phase state is a metallic state and the second phase state is an insulating state.

4. The interference device according to claim 1, wherein the device is configured to control the width of the first domains by supplying concurrently an initialization energy by the first energy source and an electrical current by the second energy source.

5. The interference device according to claim 4, wherein the device is configured to control the width by varying the time period during which the initialization energy and the electrical current are concurrently supplied.

6. The interference device according to claim 1, wherein the device is configurable as an interference filter.

7. The interference device according to claim 6, wherein the device is configured to tune the center frequency of the interference filter.

8. The interference device according to claim 1, wherein the device is configurable as an optical mirror.

9. The interference device according to claim 8, wherein the device is configurable to tune the center frequency of the optical mirror, thereby operating as a spectrometer.

10. The interference device according to claim 1,
wherein the first energy source is a heat source configured to supply heat to a first area of the phase change structure, thereby creating a domain having the first phase state.

11. The interference device according to claim 1,
wherein the first energy source is a piezoelectric device configured to apply strain to a first area of the phase change structure, thereby creating a domain having the first phase state.

12. The interference device according to claim 10, wherein the heat source is configured to supply heat pulses to the first area.

13. The interference device according to claim 10, wherein the heat source is configured to continuously supply heat, wherein the interference device further comprises a thermal switch coupled to the heat source, the thermal switch being configured to control the heat transferred from the heat source to the first area.

14. The interference device according to claim 1, wherein the first energy source is an electric field source configured to apply an electric field on a first area of the phase change structure, thereby creating a domain having the first phase state.

15. The interference device according to claim 1, wherein the device is configured to maintain a temperature of the first domains between a first transition temperature and a second transition temperature.

16. The interference device according to claim 1, wherein the control unit is configured to control the amplitude and frequency of the electrical current supplied by the second energy source.

17. The interference device according to claim 1, wherein the solid state phase change material is selected from the group consisting of $VO_2$, $V_4O_7$, $V_6O_{11}$, $V_2O_3$, $V_6O_{13}$, $V_5O_9$, $VO$, $V_8O_{15}$, $NbO_2$, $Ti_2O_3$, $LaCoO_3$, $Ti_3O_5$, $SmNiO_3$, $NdNiO_3$, $PrNiO_3$ and $Fe_3O_4$.

18. A method for configuring an interference device, the interference device comprising a phase change structure comprising a solid-state phase change material, the solid-state phase change material having a first phase state and a second phase state, the method comprising:
    supplying, by a first energy source, an initialization energy to initialize a plurality of domains having the first phase state;
    supplying, by a second energy source, an electrical current to the phase change structure to position the plurality of domains of the first phase state within the phase change structure; and
    controlling, by a control unit, the first and the second energy source to create a periodic interference pattern.

19. The method according to claim 18, the method further comprising:
    reconfiguring the interference device by creating a second periodic interference pattern comprising in an alternating way a plurality of domains of the first phase state and a plurality of domains of the second phase state, wherein the domains of the second periodic interference pattern have a different width and position than the domains of the first interference pattern.

20. A computer program product for controlling a reconfigurable interference device, comprising a phase change structure comprising a solid-state phase change material, the solid-state phase change material having a first phase state and a second phase state, said computer program product comprising a computer readable storage medium having program instructions embodied therewith, the program instructions executable by the reconfigurable interference device to perform a method comprising:
    supplying, by a first energy source, an initialization energy to initialize a plurality of domains having the first phase state;
    supplying, by a second energy source, an electrical current to the phase change structure to position the plurality of domains of the first phase state within the phase change structure;
    controlling, by a control unit, the first and the second energy source to create a periodic interference pattern.

* * * * *